United States Patent [19]

Skripek

[11] Patent Number: 5,180,926

[45] Date of Patent: Jan. 19, 1993

[54] POWER-ON RESET ARCHITECTURE
[75] Inventor: Michael R. Skripek, San Jose, Calif.
[73] Assignee: Sequoia Semiconductor, Inc., Scotts Valley, Calif.
[21] Appl. No.: 798,190
[22] Filed: Nov. 26, 1991
[51] Int. Cl.$^5$ .................. H03K 19/02; H03K 17/16
[52] U.S. Cl. .................. 307/272.3; 307/594; 307/597; 307/303; 307/573
[58] Field of Search ................ 307/591–592, 307/594, 597, 272.3, 303, 482, 573

[56] References Cited
U.S. PATENT DOCUMENTS 4,634,904  1/1987  Wong ............................ 307/603
4,888,497 12/1989  Dallabore et al. .............. 307/603
5,030,845  7/1991  Love et al. ..................... 307/592

Primary Examiner—William L. Sikes
Assistant Examiner—Margaret R. Wambach
Attorney, Agent, or Firm—Blakely, Sokoloff, Taylor & Zafman

[57] ABSTRACT

A power-on reset circuit for providing a reset signal to an active device on an integrated circuit (IC). The circuit includes a RC circuit for producing a reset signal until its capacitor fully charges. The circuit also includes a voltage detector for preventing the charge from collecting on the capacitor of the RC circuit until the voltage is at a functional level.

11 Claims, 1 Drawing Sheet

POWER-ON RESET CIRCUIT

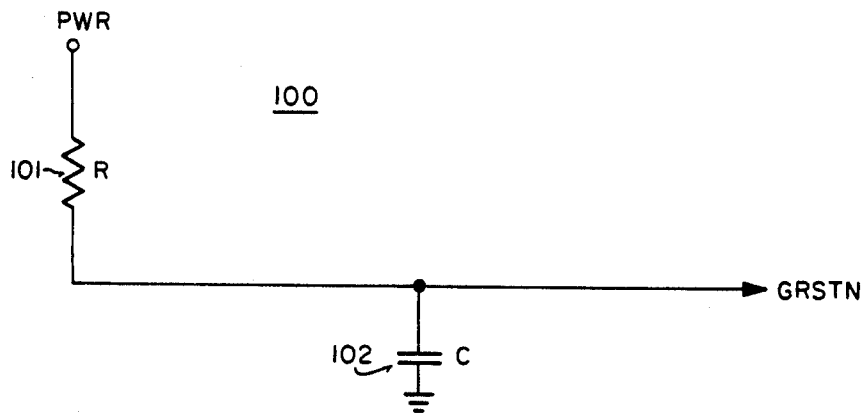
FIG_1 (PRIOR ART)
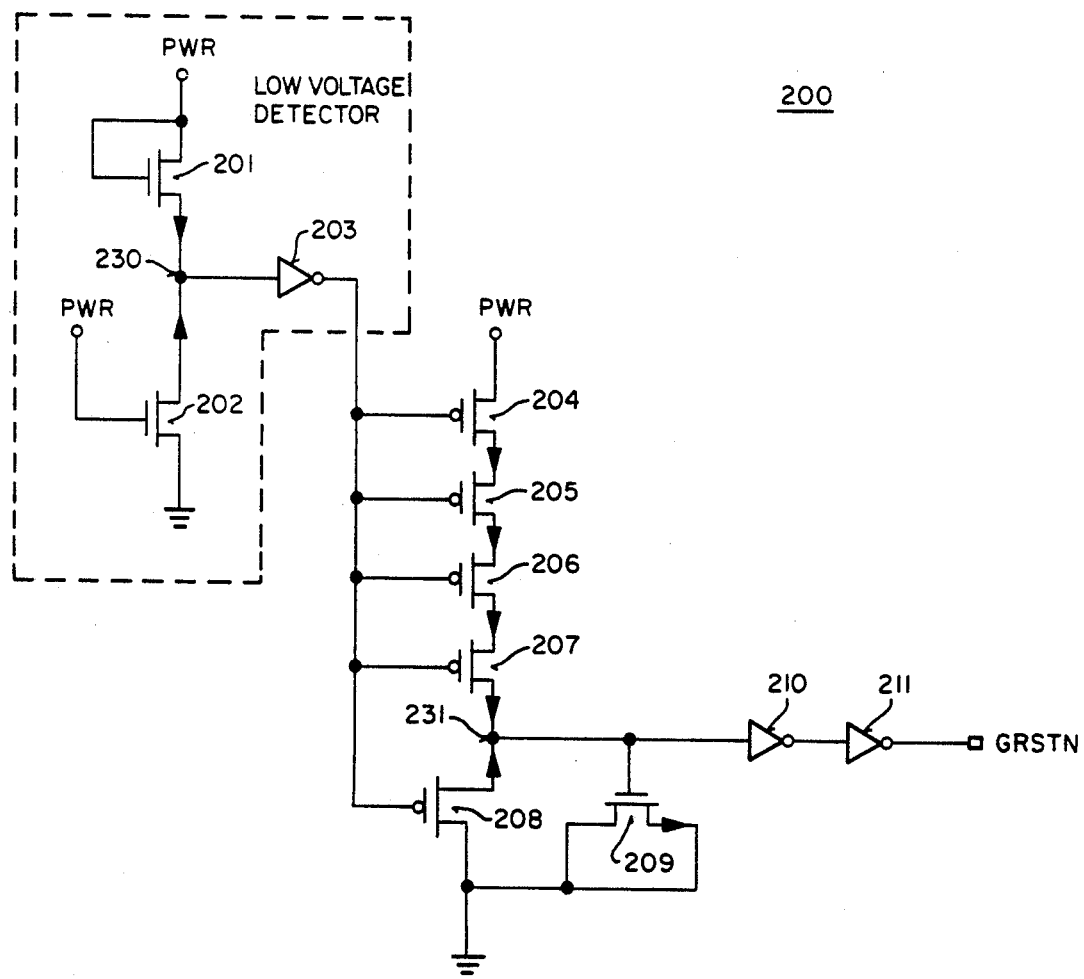
FIG_2 POWER-ON RESET CIRCUIT

POWER-ON RESET ARCHITECTURE

FIELD OF THE INVENTION

The present invention relates to the field of integrated circuits; more particularly, the present invention relates to circuitry for providing an integrated circuit with a reset signal.

BACKGROUND OF THE INVENTION

Integrated circuits (ICs) are single semiconductor chips comprising arrays of transistors and other built-in components. These gate array structures are typically configured to perform specific logic functions. When the gate array is configured to perform a specific function, an active device is created. Each active device is responsive to at least one input, such that it performs its function in response to the inputs. To function, the active device must be powered, usually from a source off the chip.

When power is applied to an active device in one of the ICs, each of the logic units within the active device is still at its previous state. New inputs into these logic units could result in improper functioning of the active device. Therefore, for an active device to function properly, its logic must be put into a known state. The logic in an active device is put into a known state when reset. After all of the circuitry has been reset, the active device is taken out of reset and is ready to perform its function.

The circuitry required to reset an active device is typically located on the same chip as the active device, and the reset operation is usually triggered by a reset signal derived from a switch on the printed circuit (PC) board or generated by power-on reset circuitry located on the chip. The power-on reset circuitry is often located on a separate chip or made with discrete components on the PC board.

One of the problems associated with power-on reset circuits in the prior art is that the circuits may not, in some instances, fully reset when power was applied to the chip. For example, the parts may be taken out of reset mode before all of the logic is reset, or a short circuit may be created in the logic circuits due to a less than functional voltage appearing on the logic. Short circuits are created, for instance, when an inverter comprises a set of complementary p-channel and n-channel devices serially coupled between power and ground having both gates coupled to the input and both drains coupled to the output. Either device would turn on if it receives either a logical 0 or a logical 1. However, if a voltage on the input of the inverter was between a logical 0 and a logical 1, both devices would conduct, creating a short between power and ground.

The present invention avoids the problems of the prior art power-on reset circuits by providing a reset circuit on the same IC of an active device which generates a reset signal having a sharp edge, such that the logic circuits receives a functional voltage while the reset function is still active. This allows all of the logic of the active device to be reset.

SUMMARY OF THE INVENTION

A power-on reset circuit for providing a reset signal to an active device on an integrated circuit (IC) is described. The power-on reset circuit includes a reset signal generation apparatus which asserts a reset signal for a predetermined time. The reset signal generation apparatus comprises a time delay circuit for controlling the length of the predetermined time. The time delay circuitry includes an RC circuit, wherein the reset signal is asserted while the capacitor is charging. The reset signal is deasserted when the capacitor is sufficiently charged. The reset signal generation apparatus also includes a discharge apparatus for discharging the capacitor when the power drops below a predetermined functional level. In this situation, the reset signal generation apparatus re-asserts the reset signal. The reset signal generation means also includes an output buffer for providing a sharp edge on the reset signal. The circuit also includes a voltage dependent delay circuit for preventing the time delay circuit from beginning operation until the power reaches a predetermined functional level. In this manner, the voltage dependent delay circuit prevents a charge from collecting on the capacitor of the RC circuit until the voltage on the active device on the power-on reset circuit is at least at a functional level. The functional level is the point at which the active device is fully operational. When the active device is CMOS, the voltage level is 2.5 volts. The voltage dependent delay also detects when the power supply voltage drops below the functional level and triggers the discharge apparatus, such that the active device is placed into reset.

BRIEF DESCRIPTION OF THE DRAWINGS

The present invention will be understood more fully from the detailed description given below and from the accompanying drawings of the preferred embodiments of the invention, which, however, should not be taken to limit the invention to this specific embodiment, but are for explanation and understanding only.

FIG. 1 is a circuit schematic of a prior art power-on reset circuit.

FIG. 2 is a circuit schematic of the currently preferred embodiment of the power-on reset circuitry of the present invention.

DETAILED DESCRIPTION OF THE PREFERRED EMBODIMENT

A circuit architecture for providing a reset signal to an active device in an integrated circuit (ICs) is described. In the following description, numerous specific details are set forth such as specific circuit element values and voltage levels, etc., in order to provide a thorough understanding of the present invention. It will be obvious, however, to one skilled in the art that the present invention may be practiced without the specific details. In other instances, well-known operations and circuit interactions have not been described in detail to avoid unnecessarily obscuring the present invention.

FIG. 1 illustrates the circuit schematic of a prior art power-on reset circuit 100. Circuit 10 provides a reset signal to an active device (not shown) in an integrated circuit (IC). The active device resets in response to an active low, such that when the reset signal is a logical 0, the active device is resetting. However, if the reset signal is a logical 1, then the active device is not in reset. Referring to FIG. 1, resistor 101 is coupled to power, PWR, and to one of the terminals of capacitor 102. The other terminal of capacitor 12 is coupled to ground. Resistor 11 is also coupled to the global reset node, GRSTN (i.e., the reset pin of the logic circuit).

Initially, capacitor 12 is not storing any charge. As power is applied to circuit 10, power is slowly applied to the capacitor 12. In response, capacitor 12 stores charge. Capacitor 12 charges up exponentially as the power ramps up, as is well-known in the art. Once capacitor 12 reaches its final equilibrium value, it acts as an open circuit and charging stops. During the first time constant capacitor 12 is charging, the output at GRSTN is a logical 0 which asserts the reset mode. When capacitor 12 charges up to its equilibrium value, the output at GRSTN becomes a logical 1. Therefore, the active device is taken out of reset.

A circuit schematic of the currently preferred embodiment of the power-on reset circuit of the present invention is shown in FIG. 2. Referring to FIG. 2, power-on reset circuit 200 comprises transistors 201, 202, and 204–209, and inverters 203, 210, and 211. The source and gate of transistor 201 are coupled to power while the drain is coupled to the input of inverter 203 and the drain of transistor 202. Transistor 201 is a strong device. In the currently preferred embodiment, its width is 100 (microns)μ. The gate of transistor 202 is coupled to power and its source is coupled to ground. As with transistor 201, the drain of transistor 202 is coupled to the input of inverter 203. Transistor 202 is a weak device. In the currently preferred embodiment, its width is 4μ, while its length is 20μ. Both transistors 201 and 202 require 0.7 volts to turn on.

The output of the inverter 203 is coupled to the gates of the p-channel transistors 204–207 and n-channel transistor 208. The source of transistor 204 is coupled to power. The drain is coupled to the source of transistor 205. The drain of transistor 205 is coupled to the source of transistor 206. The drain of transistor 206 is coupled to the source of transistor 207. The drain of transistor 207 is coupled to the drain of transistor 208 and the gate of transistor 209. The source of transistor 208 is coupled to ground. The source and drain regions of transistor 209 are also coupled to ground. The drains of transistors 207 and 208 and the gate of transistor 209 are coupled to the input of inverter 210. The output of inverter 210 is coupled to the input of inverter 211. The output of inverter 211 goes to the global reset pin, GRSTN, of the active device in the IC.

Transistor 204–207 and transistor 209 form an RC circuit like that of FIG. 1. Transistor 204–207 constitute resistor 101, and transistor 209 constitutes capacitor 102. In the present invention, the values of transistors 204–207 and transistor 209 are chosen such that their combined RC values is equal to or greater than 200 nanoseconds. Furthermore, transistors 204–207 are weak devices, such that the lengths of the transistors are longer than the widths. In the currently preferred embodiment, transistors 204–207 are each 4(μ) wide and 50μ long. However, transistors 204–207 could be replaced with equivalent circuitry, such as one transistor 4μ wide and 200μ long.

Upon power-up of the IC, power is applied to the active device and power-on architecture 200 (the application of the power to the active device is not shown). When the power is from 0 to approximately 0.7 volts, the active device is in an unknown state. When power ramps to at least 0.7 volts, both transistors 201 and 202 turn on. However, transistor 201, being a strong device, only minimally influences the voltage at node 230 when the voltage is low. Due to this slight influence, transistor 202 pulls down on the drain of transistor 201 at node 230. The effect of transistor 202 is to pull node 230 to ground. However, as the power ramps up, an increasing positive voltage appears at node 230, and similarly on the input of inverter 203, because transistor 202 is a weak device and transistor 201, being a stronger device, pulls up on the voltage at the node. Initially, the voltage on the input of inverter 203 has a minimal effect. Inverter 203 does not produce a change on its output until the voltage on its input reaches a predetermined level. In the currently preferred embodiment, inverter 203 produces a change on its output or "trips" when its input voltage reaches 1.8 volts. Hence, since there is a 0.7 voltage drop across transistor 201, the power must ramp to 2.5 volts before an output change will occur from inverter 203. Thus, transistors 201 and 202 in conjunction with inverter 203 form a low voltage detector which produces a change on its output at 2.5 volts. The 2.5 volt trip point is chosen because complementary metal-oxide semiconductor (CMOS) begins its operation at 2 complementary metal-oxide semiconductor (CMOS) begins its operation at 2 volts. The 0.5 volts, which tests the 2.5 volts required to trip, was added to ensure that a functional voltage is put on the logic.

Until inverter 203 trips, at 1.8 volts, its output is a logical 1. Therefore, p-channel transistors 204 through 207 do not conduct. However, transistor 208 does conduct. Thus, node 231 becomes coupled to ground. When this occurs, any charge on the capacitor, i.e. transistor 209, is dissipated through transistor 208 to ground. The discharge occurs very quickly, in the currently preferred embodiment it takes between 10–15 nanoseconds. Therefore, a logical 1 output of inverter 203 acts to remove charge from the gate of transistor 209. When this occurs, the input to inverter 210 sees a logical 0. In response to the logical 0 input, inverter 210 outputs a logical 1. In response to logical 1 output of inverter 210, inverter 211 outputs a logical 0. In the currently preferred embodiment, when the voltage applied to the global reset node, GRSTN, equals 0 volts, the active device in the IC is reset. Thus, from the time power is turned on to the time inverter 203 outputs a logical 0 (i.e., when the power is greater than 2.5 volts), the output at GRSTN is a logical 0 and the active device is in reset.

When inverter 203 does trip (i.e., when power is greater than 2.5 volts), its output is a logical 0. This causes p-channel transistors 204–207 to turn on. In this situation, node 231 begins to move towards a positive potential. Also, the output of a logical 0 from inverter 203 causes transistor 208 to turn off. Therefore, node 231 is disconnected from ground and any discharging of the gate of transistor 209 (i.e., the capacitor) discontinues. Thus, when node 231 begins moving towards a positive potential, the gate of transistor 209 starts charging. The charging occurs exponentially over time in a manner well-known in the art. When the gate is sufficiently charged, the input to inverter 210 is a logical 1. In response to the logical 1 input, inverter 210 outputs a logical 0. In response to the logical 0 at the output of inverter 210, inverter 211 outputs a logical 1. When this occurs, the active device is taken out of reset.

The addition of the low voltage detector, transistor 201 and 202 and inverter 203, prevents the charging of the capacitor, transistor 209, when a low voltage has been detected. Hence, the low voltage detector of inverter 203 and transistors 201 and 202 act as a voltage dependent delay which prevents the operation of the RC circuit of power-on architecture 200 from charging, thereby allowing the active device to receive a functional voltage for resetting. By preventing transistor 209 from charging, the active device is in reset longer and the active device logic is subjected to a voltage capable of resetting it (i.e., a functional voltage). Thus, when the power reaches a sufficiently high, functional level, the output of inverter 203 flips and the four weak transistors, transistors 204-207, are turned on. By preventing the charge from rising until a stable voltage appears, the active device is allowed to fully reset. This improves the reliability of the reset upon power up of the active device.

When a low voltage appears on the PWR node (i.e., below 2.5 volts), the output of inverter 203 flips to a logical 1. This causes transistors 204-207 to turn off, while transistor 208 turns on. Transistor 208 drains the charge off the gate of transistor 209 (i.e., the capacitor) by coupling transistor 209 to ground. When transistor 209 is sufficiently discharged, the active device is put into reset. The active device is held in reset until the power ramps to a high potential again. It should be noted that although transistor 209 discharges quickly, it does not discharge fast enough to put the active device in reset for every fluctuation in voltage below the 2.5 volts required to trip inverter 203. In the currently preferred embodiment, the active device will be placed into reset where the voltage fluctuation below the trip point lasts at least 10-15 nanoseconds.

Inverter 210 ensures that the reset signal always has a sharp edge. Since the input of inverter 210 ramps up very slowly, its input threshold must be high enough in order to make effective use of the RC circuit output. The high input threshold of inverter 210 ensures that a high enough voltage must be on its input before it trips. Thus, when inverter 210 does receive that input, its output will change very quickly. In the currently preferred embodiment, inverter 210 gets one RC time constant before its output changes. In the currently preferred embodiment, inverter 210 is a CMOS device in which its p-channel device is 20$\mu$ over its minimum length and its n-channel device is 5$\mu$ over its minimum length.

Inverter 211 is the driver for the reset signal and functions as an amplifier, such that when inverter 210 experiences a change on its output, inverter 211 produces a rapid change on its output. When inverter 211 receives the output from inverter 210, it outputs an amplified signal, such that it ensures that a solid or good low output signal is low and a high output signal is high. In the currently preferred embodiment, inverter 211 is a CMOS device in which its p-channel device is 100$\mu$ over its minimum length and its n-channel device is 50$\mu$ over its minimum length.

Whereas many alterations and modifications of the present invention will no doubt become apparent to a person of ordinarily skill in the art after having read the foregoing description, it is to be understood that the particular embodiment shown and described by illustration are in no way intended to be considered limiting. Therefore, reference to the details of the preferred embodiments are not intended to limit the scope of the claims which themselves recite only those features regarded as essential to the invention.

A power-on reset circuit for providing an integrated circuit with a reset signal has been described.

I claim:

1. A circuit architecture generating a reset signal for resetting an active device in an integrated circuit (IC), said active device being reset in response to said reset signal, said circuit architecture comprising:

first delay means for generating a first signal, said first signal at a first logic level when said active device is powered below a predetermined level and at a second logic level when said active device is powered to at least said predetermined level, said predetermined level being the functional power level of said active device; and second delay means for generating said reset signal to said active device in response to said first signal being as said first logic level, said second delay means generating said reset signal until a first predetermined time after said first delay means generates said first signal at said second logic level, such that after said first predetermined time, said second delay means discontinues resetting said active device, and further wherein after said active device is powered to said predetermined level, said first delay means asserts said first signal at said first logic level when said active device becomes powered below said predetermined level for a second predetermined time, such that said second delay means reasserts said reset signal.

2. The circuit architecture as defined in claim 1 wherein said first delay means comprises a low voltage detector.

3. The circuit architecture as defined in claim 1 wherein said second delay means comprises an RC circuit.

4. A circuit architecture for providing a reset signal for an active device in an integrated circuit (IC), said active device being reset in response to said reset signal, said circuit architecture comprising:

a low voltage detector for generating a first signal, said first signal at a first logic level when said active device is powered below a predetermined level and at a second logic level when said active device is powered to at least said predetermined level, said predetermined level being the functional power level of said active device; and RC circuit means coupled to said low voltage detector, said RC circuit means generating said reset signal in response to said first signal being at said first logic level and discontinuing said reset signal after a first predetermined time, said first predetermined time beginning in response to said first signal being at said second logic level, and further wherein after said active device is powered to said predetermined level, said low voltage detector asserts said first signal at said first logic level when said active device becomes powered below said predetermined level for a second predetermined time, such that said RC circuit means reasserts said reset signal.

5. The circuit architecture as defined by claim 4 wherein said second predetermined time comprises the time required to discharge the capacitor of said RC circuit means.

6. The circuit architecture as defined by claim 5 wherein said predetermined time is set according to the RC time constant of said RC circuit.

7. The circuit architecture as defined by claim 5 wherein the RC constant of said RC circuit is greater than or equal to 200 nanoseconds.

8. The circuit architecture as defined in claim 4 wherein said power level is 2.5 volts.

9. A circuit architecture for providing a reset signal for an active device in an integrated circuit (IC), said active device being reset in response to said reset signal, said circuit architecture comprising:
  a low voltage detector for generating a first signal, said first signal at a first logic level when said active device is powered below a predetermined level and at a second logic level when said active device is powered to at least said predetermined level, said predetermined level being the functional power level of said active device; and
  RC circuit means coupled to said detection means, the capacitor of said RC circuit means discharging in response to said first signal, such that said reset signal is generated when said capacitor is discharged, and said capacitor of said RC circuit means charging in response to said first signal being at a second logic level, such that after said capacitor is sufficiently charged, said RC circuit means discontinues asserting said reset signal, and further wherein after said active device is powered to said predetermined level, said low voltage detector asserts said first signal at said first logic level when said active device becomes powered below said predetermined level long enough to discharge said capacitor, such that said RC circuit means reasserts said reset signal.

10. The circuit architecture as defined by claim 9 further comprising output buffer means for providing said reset signal to said active device with a sharp edge.

11. The circuit architecture as defined by claim 9 wherein said low voltage detector includes an inverter for generating said first signal, said inverter having a trip point at said predetermined level.

* * * * *